United States Patent [19]

Papiernik

[11] Patent Number: 4,587,485
[45] Date of Patent: May 6, 1986

[54] EVALUATION ARRANGEMENT FOR A DIGITAL INCREMENTAL TRANSMITTER

[75] Inventor: Wolfgang Papiernik, Erlangen, Fed. Rep. of Germany

[73] Assignee: Siemens Aktiengesellschaft, Berlin and Munich, Fed. Rep. of Germany

[21] Appl. No.: 519,579

[22] Filed: Aug. 2, 1983

[30] Foreign Application Priority Data

Aug. 27, 1982 [DE] Fed. Rep. of Germany ....... 3231990

[51] Int. Cl.$^4$ .................... G01P 3/44; G01P 13/00
[52] U.S. Cl. ..................... 324/166; 324/160; 324/175; 340/870.31; 340/870.37; 250/231 SE
[58] Field of Search ......... 364/565, 729, 559; 250/231 SE; 324/163, 160, 165, 166, 167, 175; 340/870

[56] References Cited

U.S. PATENT DOCUMENTS

| 3,811,091 | 5/1974 | Ha ........................................ 324/175 |
| 3,819,268 | 6/1974 | Johnson ............................... 324/175 |
| 3,956,623 | 5/1976 | Clark .................................... 364/729 |
| 4,077,063 | 2/1978 | Lind ..................................... 364/729 |
| 4,228,396 | 10/1980 | Palombo ............................. 324/163 |

FOREIGN PATENT DOCUMENTS 3218101 11/1983 Fed. Rep. of Germany ...... 324/166

OTHER PUBLICATIONS

"Siemens-Zeitschrift", 1960, pp. 669–671.
"Siemens Components", 1981, No. 1, pp. 12 and 13.

Primary Examiner—Reinhard J. Eisenzopf
Assistant Examiner—Jose M. Solis
Attorney, Agent, or Firm—Kenyon & Kenyon

[57] ABSTRACT

An evaluation arrangement for a digital incremental transmitter of the type wherein two phase-shifted sinusoidal voltages of the same period are produced generates a periodic triangular voltage signal which is subsequently converted to digital values. The digital values are produced in response to an interlinking of linear portions of the sinusoidal voltages. The digital values are used to address a read-only memory in which are stored a plurality of absolute values within a period.

6 Claims, 6 Drawing Figures

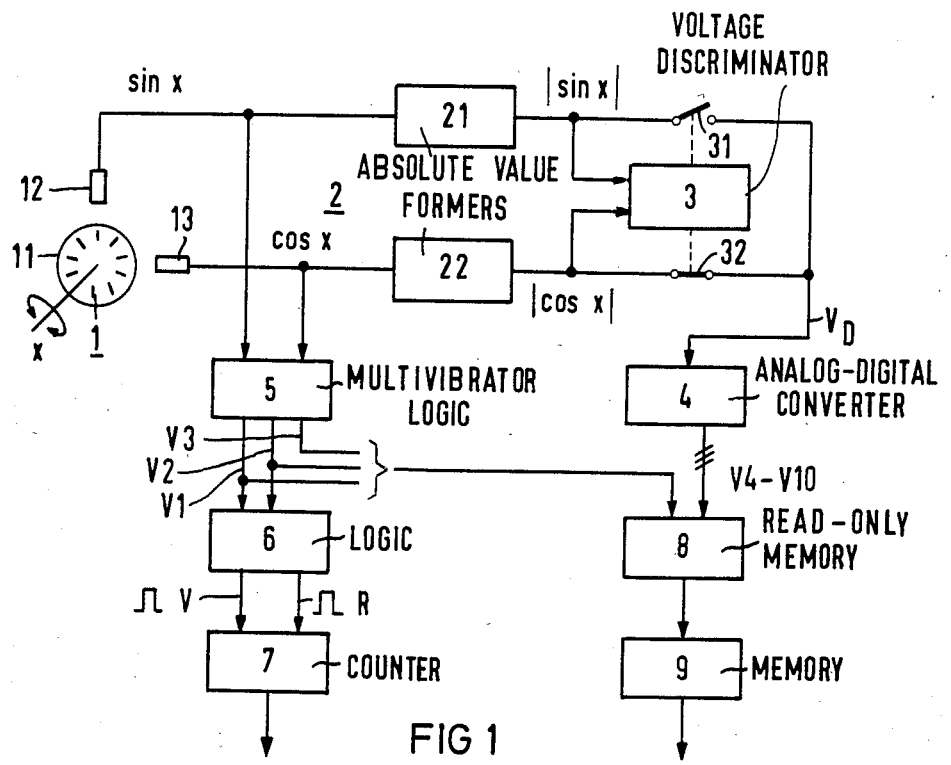
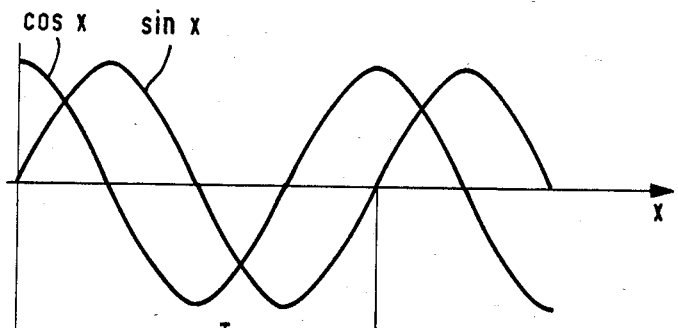
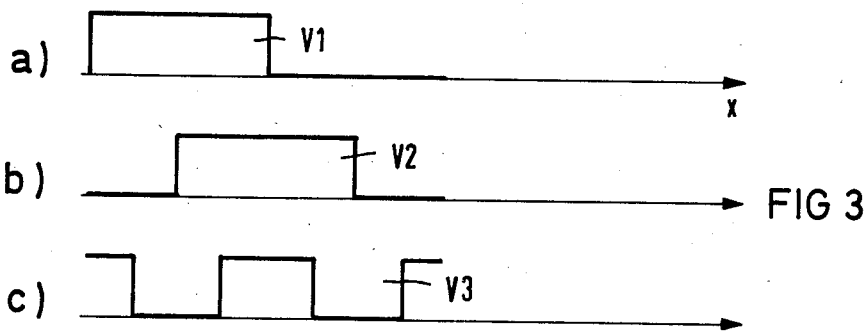
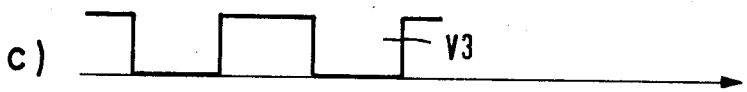

EVALUATION ARRANGEMENT FOR A DIGITAL INCREMENTAL TRANSMITTER

BACKGROUND OF THE INVENTION

This invention relates generally to evaluation arrangements for digital incremental transmitters or generators, and more particularly, to a digital incremental transmitter or generators which produces several angle-dependent sinusoidal voltages of substantially equal amplitude and which are shifted in phase with respect to one another by a predetermined phase angle.

Incremental transmitters can be designed as linear or rotary systems to operate, for example, on a photoelectric or a magnetic basis. It is a common feature of all such systems that the zero crossings, or interlinkages of the sinusoidal voltages, are evaluated and are utilized for imaging a distance. Since the produced sinusoidal voltages correspond to the travel of the transmitter system, typically, this can be done by converting the sinusoidal voltages into a number of meansurement pulses proportional to the number of period of the voltages. An illustrative magnetic type of digital transmitter is described in "Siemens-Zeitschrift", 1960, pages 669–671. A digital transmitter of the type which operates optically is described in the journal "Siemens Components", 1981, No. 1, pages 12 and 13.

It is a problem with known incremental transmitters that they do not provide measurement signals having sufficient resolution. Thus, it is desirable to increase the accuracy of distance measurements, particularly in situations where digital incremental transmitters are used in machine tools.

It is, therefore, an object of this invention to provide an evaluation arrangement wherein, in addition to counting periods of the sinusoidal voltages, intermediate values between such periods can be provided in the form of absolute values.

SUMMARY OF THE INVENTION

The foregoing and other objects are achieved by this invention which provides an evaluation arrangement for a digital incremental transmitter of the type having, in one embodiment, two distance or angle-dependent sinusoidal voltage outputs of equal amplitude, which voltage outputs are shifted in phase with respect to one another by 90°. The voltage outputs are of the type which can be converted into a value which is proportional to the count of the periods of the produced sinusoidal voltage outputs. In accordance with the invention, a periodic triangular voltage waveform having a fundamental frequency which is an integral multiple of the frequency of the sinusoidal voltage is produced by interlinking linear portions of the sinusoidal voltages. In this embodiment, since the sinusoidal voltages are shifted in phase by 90°, one output is considered to produce a voltage proportional to a sine function, and the other is proportional to a cosine function. The triangular voltage is converted into corresponding digital values which, in conjunction with logic signals derived from the sinusoidal output voltages, serve to address a read-only memory in which corresponding absolute values within a period are stored.

In a specific illustrative embodiment of the invention, the evaluation arrangement forms the absolute values of the sine and cosine output voltages, selects the smaller of the two voltages, and converts the resulting triangular voltage into corresponding digital values. In a further embodiment, each of the voltage outputs is provided with an associated absolute-value former, an associated voltage discriminator, and an analog-digital converter connected thereto, the output of the analog-digital converter providing address signals to the read-only memory. In a still further embodiment of the invention, circuitry is provided for selecting the larger of the absolute values formed by the absolute value formers and generating a trouble signal if this voltage falls below a predetermined reference value.

BRIEF DESCRIPTION OF THE DRAWINGS

Comprehension of the invention is facilitated by reading the following detailed description in conjunction with the annexed drawings, in which:

FIG. 1 is a function block representation of an evaluation arrangement constructed in accordance with the invention;

FIG. 2 is a timing diagram showing two sinusoidal output voltages of the incremental transmitter arranged on a common base line;

FIG. 3 is a timing diagram showing a plurality of squarewave voltages derived from the sinusoidal voltages of FIG. 2;

DETAILED DESCRIPTION

Figure 4:
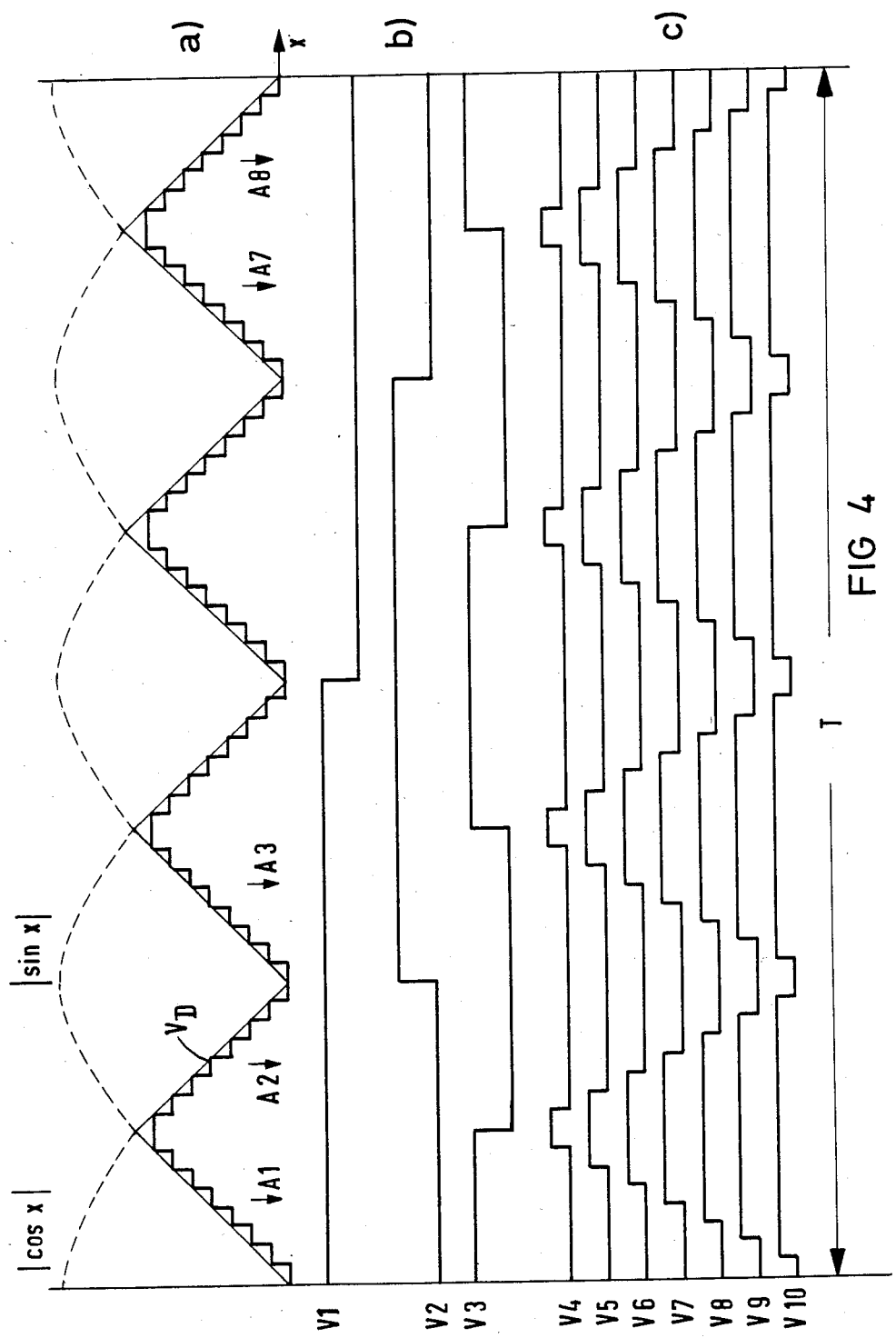
FIG. 4 is a timing diagram showing a triangular voltage waveform which is derived from the sinusoidal voltages of FIG. 2, the squarewave voltages of FIG. 3, and the digital values which are derived from the triangular voltage waveform.

A known optical incremental transmitter 1 comprises a pulse disc 11 and associated scanning devices 12 and 13, which may be sensors or pickups. The outputs of scanning devices 12 and 13 produce voltages designated with sin x and cos x, which correspond to the motions of optical incremental transmitter 1. The signals sin x and cos x are shifted in phase with respect to one another by 90°, and are approximately sinusoidal. In the vicinity of their crossing, illustratively between −45° to about +45°, the sin x and cos x signals have a practically linearly increasing shape. This results as an inherent property of the sinusoidal function, and as a result of the design of the transmitter itself, particularly an optical transmitter. A non-linear transmission member (not shown) can be provided for compensating for deviations between the sine voltage and a straight line.

A plurality of squarewave voltages V1 and V2 are generated from the voltage sin x and cos x which are shifted in phase by 90°. Moreover, a periodic squarewave voltage V3 having twice the frequency of voltages V1 and V2 is also generated. The flanks of periodic squarewave voltage V3 always fall between the flanks of the voltages V1 and V2.

In FIG. 1, forward and backward counting pulses are conducted to a counter 7 from a logic circuit 6 which generates the pulses from squarewave voltages V1 and V2 in a known manner. The count of counter 7 is representative of the distance traveled by counting the periods T, as shown in FIG. 2.

In addition to the foregoing, there is further generated from the two transmitter voltages sin x and cos x, which are shifted in phase by 90° with respect to one another, a triangular signal having a slope which is proportional to its frequency. This is accomplished in a simple manner by forming the absolute values of the two voltages $|\sin x|$ and $|\cos x|$, as shown by the dashed curves in FIG. 4, line (a), and always using the smaller of the two voltage values. This results in the triangular voltage $V_D$ which is shown within the individual circular segments shown as octants A1 to A8 within a period T of the angle of rotation x.

Two absolute value formers 21 and 22 are used for forming triangular voltage $V_D$. The absolute formers provide at their outputs the voltages sin x and cos x as absolute values $|\sin x|$ and $|\cos x|$, in an absolute value former arrangement 2, as shown in FIG. 1. These two voltages, $|\sin x|$ and $|\cos x|$ are compared against one another in a voltage discriminator 3, and only the smaller of the two voltages is evaluated. In the specific illustrative embodiment, the selection of one of the voltages is indicated by the fact that the ouputs of absolute value formers 21 and 22 are conducted selectably via switches 31 and 32 which are controlled by voltage discriminator 3. The thus generated triangular voltage $V_D$ is then conducted to an analog-digital converter 4 which operates as an instantaneous value coder with comparator (not shown). In other words, analog-digital converter 4 forms a corresponding digital value from the present triangular voltage. In this manner, an unambiguous digital value is assigned to each of the staircase steps within a branch A1 to A8, as shown in FIG. 4, line (a). The digital value can be fixed, for example, by the switching states of the individual comparators, assigned to the particular staircase step, in the analog-digital converter in the form of the voltages V4 to V10 which correspond to the logical output signals shown in FIG. 4, lines (c).

By the use of squarewave voltages V1 to V3 which are present at the output of a multivibrator logic unit 5 shown in FIG. 1 and which are depicted on FIG. 4 at lines (b), the particular branch at which the actual distance value happens to be can be determined unambiguously. Moreover, by using the state combination of the voltages V4 to V10 which form the respective digital value, the actual distance value within the branch can be determined. The respective state combinations of voltages V1 and V10 are therefore used as addresses of a read-only memory 8 in which, for example, 64 equidistant positions within the period T are stored. If one of these positions is unambiguously assigned to each of the 64 possible addresses, particularly in the form of an absolute value, then the actual distance value which is present within the period can be read at the output of read-only memory 8 under the respective address, and can be transferred to a memory 9. The distance measuring system therefore operates in an absolute manner cyclically with the periods. The period count in the coarse counter 7 and the position value within the period in memory 9 can then be called at predetermined time intervals, if required, by a computer or the like.

The above-mentioned evaluating arrangement can be used for measuring the speed of rotation or velocity such that the change of the actual distance value within the period is determined within definite sampling time periods, and serves as a measure of the velocity.

It should further be noted that it may on occasion be of advantage, if already available control elements are to be used, that new pulse sequences are derived from the voltages V1 to V10, as is already known in the evaluation of the two squarewave voltages V1 and V2 for forming counting pulses. Due to the multiplicity of further periodic squarewave voltages V3 to V10, however, the frequency of these derived pulse sequences can be increased considerably, illustratively by a factor of 20.

In optical transmitters, the triangular signal can also be used for controlling the light flux, for example, in such a manner at the maxima of the triangular voltage, which are unambiguously defined by the corresponding addresses, an interrogation is conducted whether the maximum has been reached, and the lamp current in the transmitter is changed responsively.

This can be achieved from the standpoint of circuitry in a simple manner by providing a pulse which arrives at the defined points at a counter 16 via read-only memory 8. Counter 16 counts forward or backward depending upon whether the maximum value of the triangular voltage $V_D$ is larger or smaller than a reference voltage $V_R$. The reference voltage is determined by a comparator 15. Weighted resistors 18 are connected to the outputs of counter 16 and connected to ground, depending upon the count. Thus, a varying number of resistors 18 are connected into the circuit of lamp 14 parallel to a base resistor 17, and the lamp current is thereby changed accordingly.

Figures 5, 6:
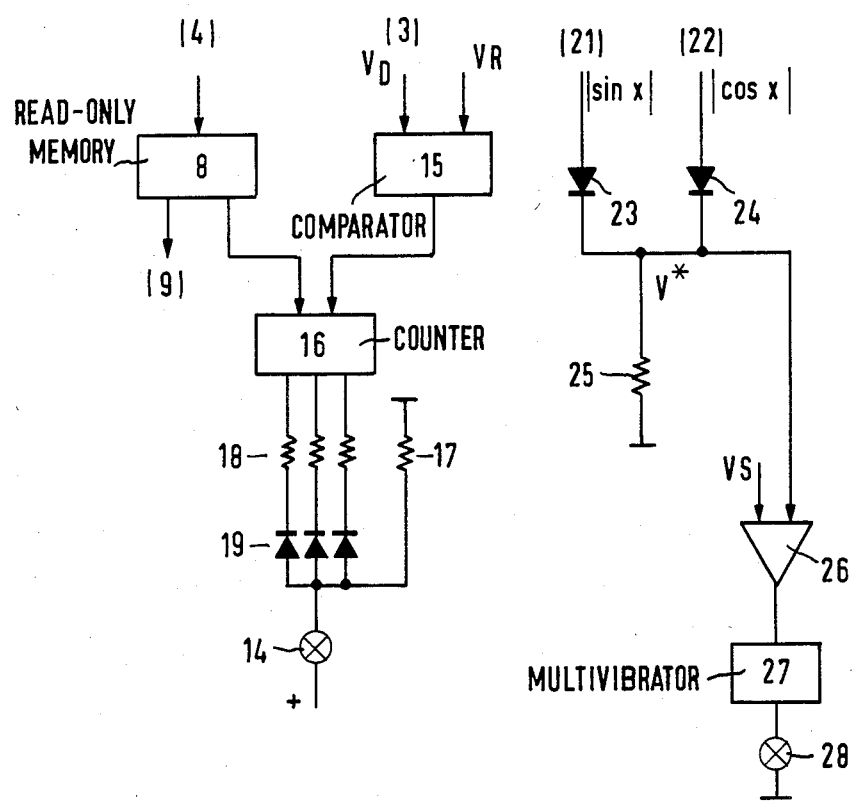
FIG. 5 is a partially schematic and partially function block representation of a control arrangement.
FIG. 6 is a partially schematic and partially function block representation of a monitoring arrangement of the invention.

The absolute values of the sinusoidal voltages which serve for generating the triangular signal can also be used for monitoring amplitudes or phase disturbances. For this purpose, the largest value is selected from the absolute values $|\sin x|$ and $|\cos x|$ by means of diodes 23 and 24. This largest value appears at resistor 25 in FIG. 6 as voltage V*. The voltage V* is compared against a reference voltage VS. If the voltage composed of the absolute values falls below this reference value VS, a multivibrator stage 27 responds and a trouble indicator light is illuminated.

Although the invention has been described in terms of specific embodiments and applications, persons skilled in the art, in light of this teaching, can generate additional embodiments without exceeding the scope or departing from the spirit of the claimed invention. Accordingly, the drawings and descriptions in this disclosure are proffered to facilitate comprehension of the invention and should not be construed to limit the scope thereof.

What is claimed is:

1. An evaluation arrangement for a digital incremental transmitter of the type having first and second transmitter outputs for producing respective sinusoidal voltages of equal amplitude which are shifted in phase by 90° with respect to one another, the evaluation arrangement further having a converter for converting the sinusoidal voltages of the first and second transmitter outputs into a measurement signal corresponding proportionally to the count of the periods of the sinusoidal voltages produced, the evaluation arrangement further comprising;

means for producing a periodic triangular voltage having a fundamental frequency which is an integral multiple of the frequency of the sinusoidal voltages in response to an interlinking of linear portions of the sinusoidal voltages;

converter means for converting said triangular voltage into corresponding digital values;

logic means for producing digital logic signals which are derived from the sinusoidal voltages and whose state combinations correspond one to one to the circular segments of the sinusoidal voltages within a period; and memory means for storing a plurality of corresponding absolute values of the sinusoidal voltages within a period, said memory means having an output for producing selected one of said absolute values and an input for receiving said digital values and said digital logic signals, said absolute values being selected in response to said digital values and said digital logic signals so as to establish the actual position value within a period of the sinusoidal voltages.

2. The evaluation arrangement of claim 1 wherein said means for producing a periodic triangular voltage comprises absolute value forming means for producing absolute value signals corresponding respectively to the sinusoidal voltages; and selector means for selecting the smaller of said absolute value signals.

3. The evaluation arrangement of claim 1 wherein there is further provided sampling means connected to said output of said memory means for determining a velocity.

4. The evaluation arrangement of claim 2 wherein said selector means comprises a voltage discriminator for selecting one of said absolute value signals.

5. The evaluation arrangement of claim 1 wherein the digital incremental transmitter is an optical incremental transmitter having a lamp for generating light, the evaluation arrangement further comprising comparator means for comparing a value of said triangular voltage against a reference value and controlling responsively a current flowing through the lamp.

6. The evaluation arrangement of claim 2 wherein there is further provided means for monitoring amplitudes or phase disturbances by producing a trouble signal responsive to a comparison of the larger of said absolute value signals against a reference value.

* * * * *